(12) United States Patent
Hu et al.

(10) Patent No.: US 11,257,836 B2
(45) Date of Patent: Feb. 22, 2022

(54) DUMMY VERTICAL STRUCTURES FOR ETCHING IN 3D NAND MEMORY AND OTHER CIRCUITS

(71) Applicant: MACRONIX INTERNATIONAL CO., LTD., Hsinchu (TW)

(72) Inventors: Chih-Wei Hu, Miaoli (TW); Teng-Hao Yeh, Hsinchu (TW); Yu-Wei Jiang, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 37 days.

(21) Appl. No.: 16/782,953

(22) Filed: Feb. 5, 2020

(65) Prior Publication Data

US 2021/0242228 A1    Aug. 5, 2021

(51) Int. Cl.
*H01L 27/11582*    (2017.01)
*H01L 27/11565*    (2017.01)

(52) U.S. Cl.
CPC .. *H01L 27/11565* (2013.01); *H01L 27/11582* (2013.01)

(58) Field of Classification Search
CPC ................................................ H01L 27/11565
See application file for complete search history.

(56) References Cited

U.S. PATENT DOCUMENTS

| 7,541,240 B2 | 6/2009 | Pham et al. |
| 9,147,468 B1 | 9/2015 | Lue |
| 9,502,349 B2 | 11/2016 | Chen |
| 10,566,348 B1 | 2/2020 | Yeh et al. |
| 2010/0207194 A1 | 8/2010 | Tanaka et al. |
| 2016/0005762 A1* | 1/2016 | Lue ........................ H01L 23/528 365/185.03 |
| 2016/0260733 A1* | 9/2016 | Lue .................... H01L 29/66742 |

FOREIGN PATENT DOCUMENTS

| TW | I384588 B | 2/2013 |
| TW | I670838 B | 9/2019 |

OTHER PUBLICATIONS

TW Office Action from TW 10921162990 dated Nov. 30, 2020, 4 pages.

\* cited by examiner

*Primary Examiner* — Christopher A Johnson
(74) *Attorney, Agent, or Firm* — Andrew Dunlap; Haynes Beffel & Wolfeld LLP

(57) ABSTRACT

A memory device comprises a stack of patterned conductor layers, at least a plurality of the layers comprising conductive strips including strips continuous with a pad and other strips isolated from the pad. An array of vertical pillars extends through the stack of patterned conductor layers, wherein memory cells are disposed at cross-points between the vertical pillars and patterned conductor layers. The array has an array boundary proximal to the pad. A first set of isolation blocks extends through the plurality of patterned conductor layers separating the strips continuous with the pad from the other strips isolated from the pad. A second set of isolation blocks inside the array boundary extends through the plurality of patterned conductor layers isolating the other strips from the pad.

11 Claims, 14 Drawing Sheets

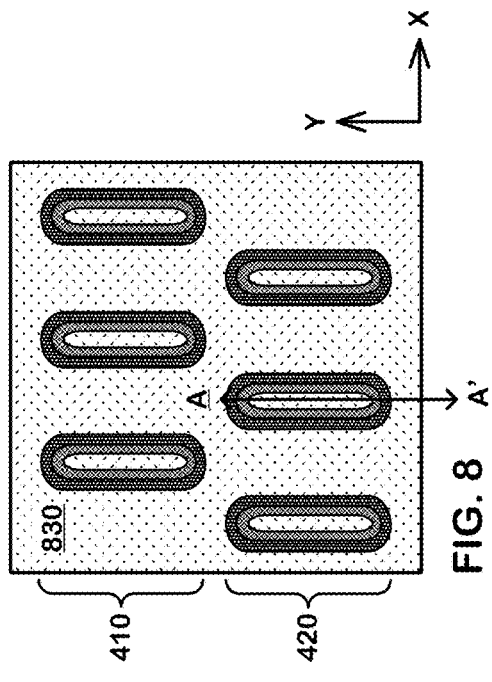
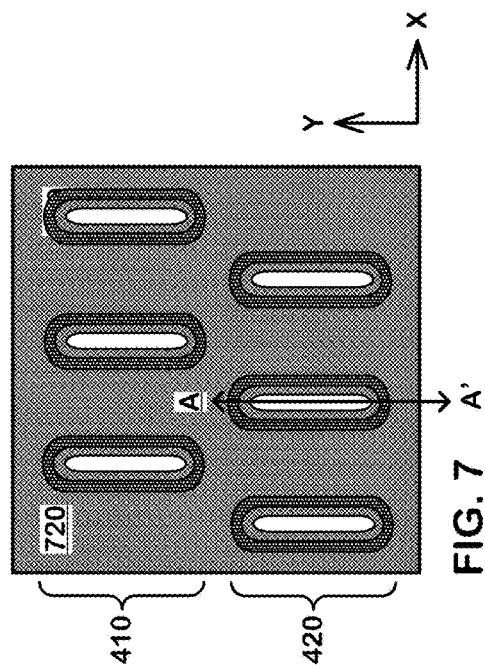
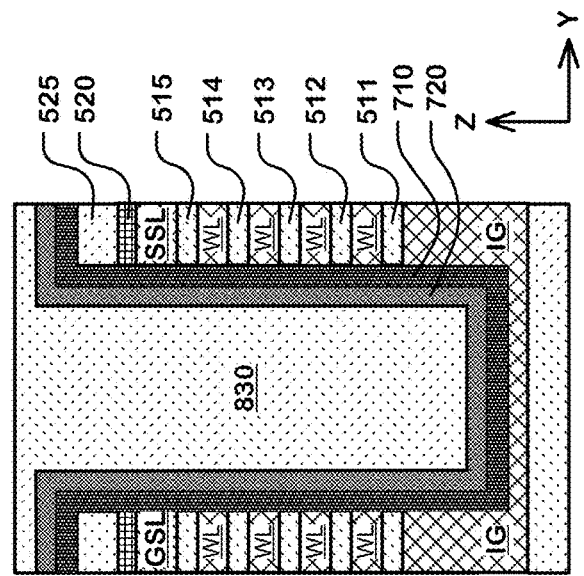
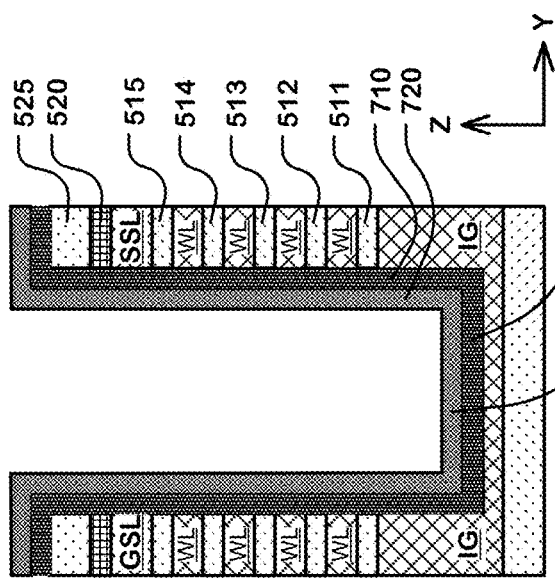

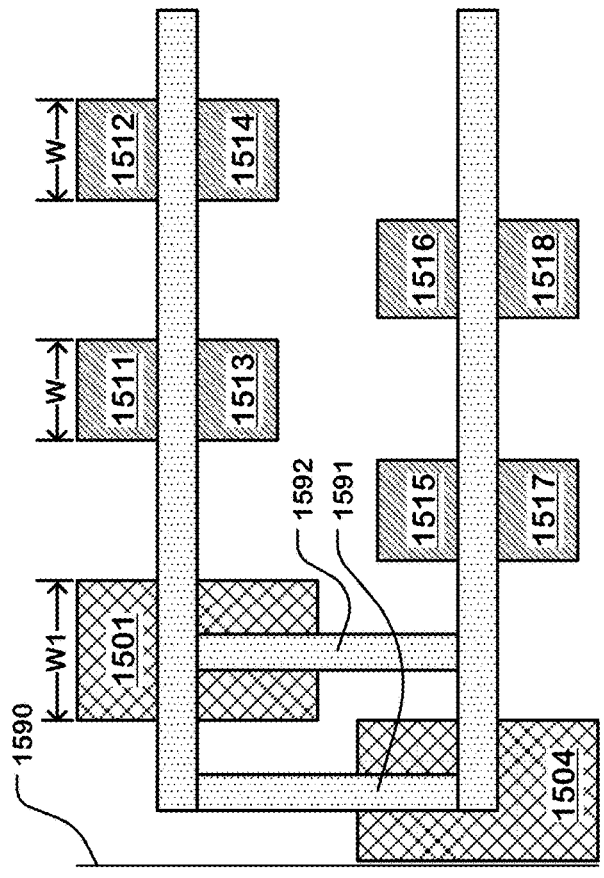
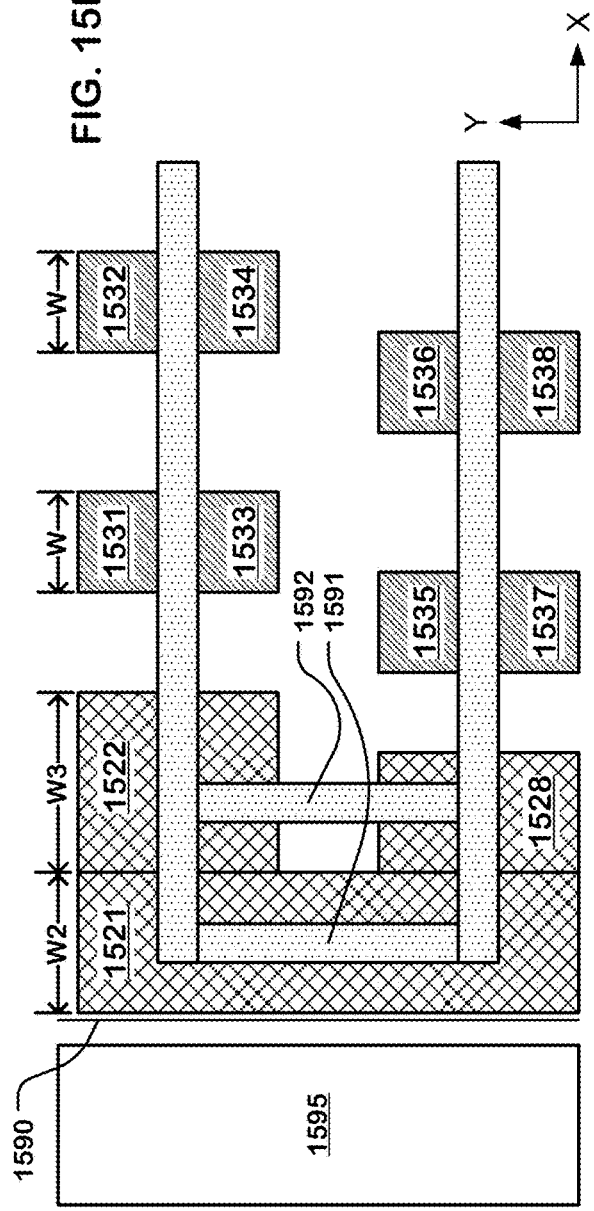

DUMMY VERTICAL STRUCTURES FOR ETCHING IN 3D NAND MEMORY AND OTHER CIRCUITS

BACKGROUND

Field

The present invention relates to high density memory devices, and particularly to memory devices in which multiple planes of memory cells are arranged to provide a three-dimensional 3D array.

Description of Related Art

As critical dimensions of devices in integrated circuits shrink to the limits of common memory cell technologies, designers have been looking to techniques for stacking multiple planes of memory cells in three-dimensional circuits to achieve greater storage capacity, and to achieve lower costs per bit.

A three-dimensional memory can include blocks of memory cells arranged in multiple planes in an array region, and word line pads in each plane in a pad region for making connection to the word lines that reach into the array region from the pads. Forming the multiple planes can include etching patterns through many layers of materials.

However, the etch rate during etching these patterns through the layers may be different in the array regions than in the pad regions because of differences in the structures being formed that occur at the time of the etching. Consequently, a cut may cut through a different number of layers in the array region than in the pad region. To cut the same number of layers of conductive material in the array region and in the pad region, two cuts having different etch rates may need to be used, adding expense to the manufacturing process.

It is desirable to provide a structure that is more easily manufactured for three-dimensional integrated circuit memory.

SUMMARY

The present technology provides a structure that is more easily manufactured for three-dimensional integrated circuits, including memory circuits having array regions and pad regions, and other three-dimensional circuits having regions of more dense structures coupled to pad regions used for vertical interconnections.

In an embodiment described herein, an integrated circuit structure includes 3D memory having an array region in which an array of vertical pillars extends through the multiple layers, with horizontal conductive strips in each layer extending to a pad in a pad region. The array region has a boundary proximal to the pad region. Isolation blocks are disposed inside the boundary of the array region, which separate horizontal conductive lines from the pad. In some embodiments, other horizontal conductive lines are not separated from the pad by isolation blocks, so that an interdigitated pattern can be formed in each layer. Vertical pillars not used for memory cells are disposed along the array boundary, between the isolation blocks and the pad region. Vertical pillars used for memory cells are disposed in operational relationships to the horizontal conductive lines. The vertical pillars can be vertical channel structures for vertical NAND strings, and the horizontal conductive lines can be word lines.

This arrangement of isolation blocks inside the array region can be formed using a patterned etch in which slits are cut inside the array boundary through the stack of patterned conductor layers to both pattern the conductive strips in lines through the array, and to pattern the ends of the conductive strips isolated from a pad. Placing the isolation blocks for the ends of the conductive strips inside the array region, enables use of a single cut using a single mask for the slits, because of the more uniform etch rate inside the array region for both the ends and the sides of the conductive lines. This can result in an array region including regions where vertical pillars used for memory cells, and in regions proximal to the pads including vertical pillars not used for memory cells and which may extend through the pads. Because the etch rate is the same or similar for cutting through the vertical pillars used for memory cells and vertical pillars not used for memory cells, the single cut can cut through the same number of patterned conductor layers through the vertical pillars used for memory cells and vertical pillars not used for memory cells inside an array boundary.

Also, in an embodiment described herein, an integrated circuit structure includes 3D memory having an array region in which an array of vertical pillars extends through the multiple layers, with horizontal conductive strips in each layer extending to a pad in a pad region. The memory can comprise multiple blocks of memory cells, where each block can include an array region and a pad region as discussed above. In embodiments including multiple memory blocks, the array region can be extended into regions between memory blocks by formation of a pattern of vertical pillars in the regions between the memory blocks. The array region has a boundary proximal to the pad region between memory blocks. Isolation blocks are disposed through the extended region of the array region to separate the patterned conductor layers between adjacent memory blocks. Vertical pillars not used for memory cells are disposed between the memory blocks. This enables use of the same single cut using the same single mask can be used to etch a memory block boundary slit across the vertical pillars not used for memory cells through the stack of patterned conductor layers.

A memory device is described comprising a stack of patterned conductor layers, at least a plurality of the layers comprising interdigitated conductive strips including strips continuous with a pad and other strips isolated from the pad. An array of vertical pillars can extend through the stack of patterned conductor layers, wherein memory cells are disposed at cross-points between the vertical pillars and patterned conductor layers. The array has an array boundary proximal to the pad. A first set of isolation blocks can extend through the plurality of patterned conductor layers separating the strips continuous with the pad from the other strips isolated from the pad. A second set of isolation blocks inside the array boundary can extend through the plurality of patterned conductor layers isolating the other strips from the pad. The array boundary can extend into the pad beyond an end of isolation blocks in the first set of isolation blocks by one or more vertical pillars. The second set of isolation blocks can include isolation blocks connecting a pair of adjacent isolation blocks in the first set of isolation blocks. Some of the vertical pillars between the pad and the other strips isolated from the pad can be penetrated by the isolation blocks in the second set of isolation blocks inside the array boundary. The device can include a second pad, wherein the strips continuous with the first-mentioned pad can be separated from the second pad at ends proximal to the second pad, and strips continuous with the second pad can be separated from the first-mentioned pad at ends proximal to the first-mentioned pad.

The device can include a block of vertical pillars inside the array boundary, and a third pad disposed opposite the first-mentioned pad in a second direction orthogonal to the first direction. The device can include first and second boundary rows of vertical pillars extending in the first direction through the stack of patterned conductor layers. The first and second boundary rows can be disposed adjacent and spanning the first-mentioned pad and the block of vertical pillars, where the vertical pillars in the first and second boundary rows may not be used for memory cells. A block isolation structure extending through the stack of patterned conductor layers can separate the first-mentioned pad from the third pad, where the vertical pillars in the first and second boundary rows can be in contact with sides of the block isolation structure. The device can include a second block of vertical pillars disposed opposite the first-mentioned block of vertical pillars in the second direction, where the block isolation structure can separate the first-mentioned block of vertical pillars from the second block of vertical pillars.

A method is also provided for manufacturing a memory device as described herein.

Other aspects and advantages of the present invention can be seen on review of the drawings, the detailed description and the claims, which follow.

BRIEF DESCRIPTION OF THE DRAWINGS

FIGS. 4-13 illustrate stages of an example manufacturing process for a memory device in accordance with an embodiment.

FIGS. 4, 5, 5A, 6, 6A illustrate stages of the process flow for forming an array of holes through a stack of patterned conductor layers.

FIGS. 7 and 7A illustrate a stage of the process flow after forming vertical pillars on sidewalls of the holes.

FIGS. 8 and 8A illustrate a stage of the process flow after filling the holes with an insulating material.

FIG. 9 illustrates a photoresist hard mask suitable for etching a first set of slits and a second set of slits over the structure shown in FIG. 4.

FIG. 10 illustrates a stage of the process flow after etching a first set of slits and a second set of slits through a stack of conductor layers using a single photoresist hard mask such as shown in FIG. 9.

FIG. 11 illustrates a stage of the process flow after forming a first set of isolation blocks and a second set of isolation blocks.

FIGS. 12 and 12A illustrate a stage of the process flow after forming a common source line and a set of bit lines coupled to a plurality of vertical pillars used for memory cells.

FIG. 13 illustrates vertical pillars not used for memory cells.

FIGS. 15A, 15B and 15C illustrate alternative implementations of vertical pillars not used for memory cells inside the array boundary disposed between a pad and a plurality of vertical pillars used for memory cells.

DETAILED DESCRIPTION

The following description will typically be with reference to specific structural embodiments and methods. It is to be understood that there is no intention to limit the technology to the specifically disclosed embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows.

Figure 1:
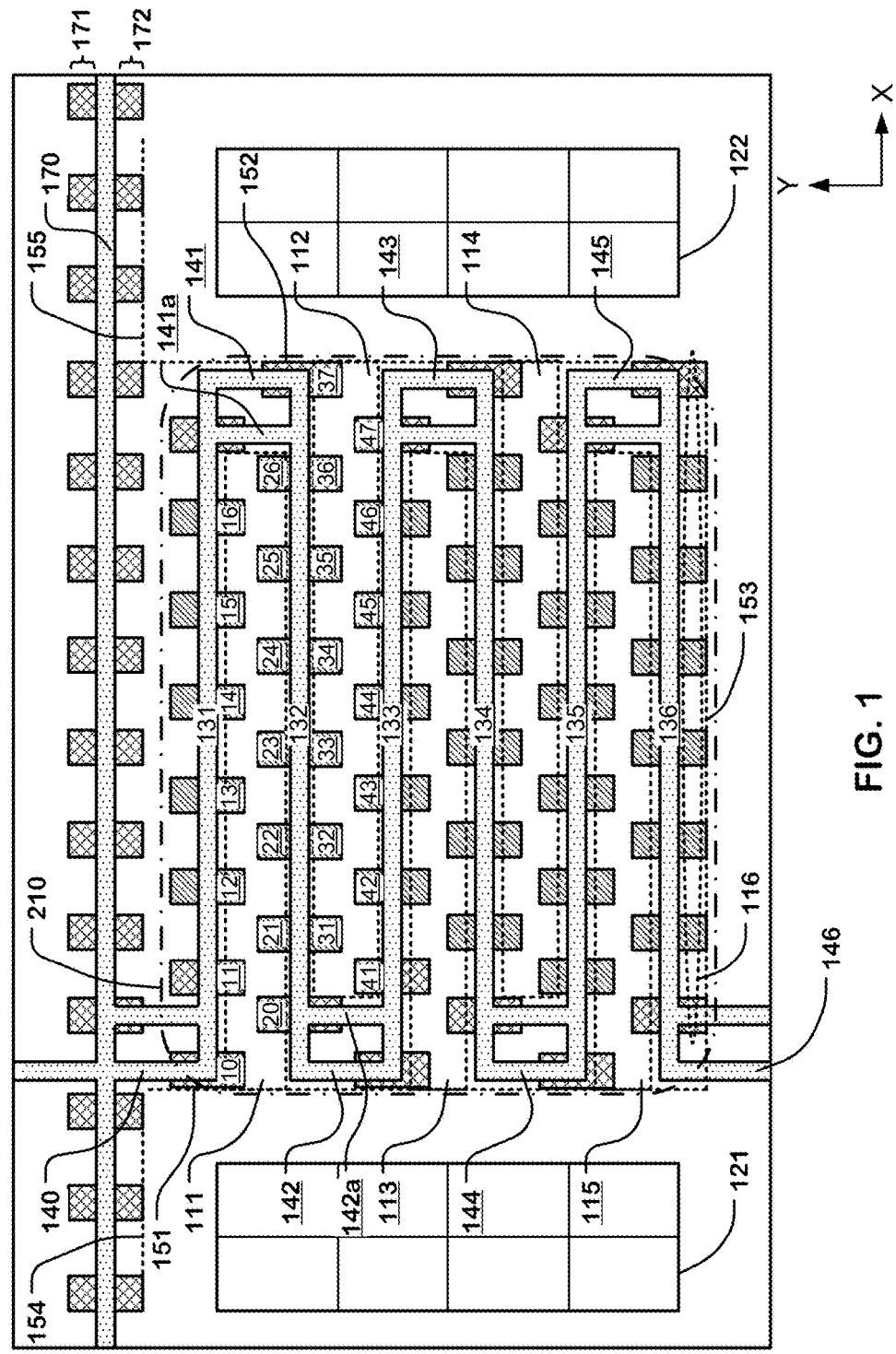
FIG. 1 illustrates a simplified layout view of an example 3D memory device taken at a patterned conductor layer.

FIG. 1 illustrates a simplified layout view 100 of an example 3D memory device taken at a patterned conductor layer in a stack of patterned conductor layers. As shown in the example of FIG. 1, the 3D memory device comprises interdigitated conductive strips including strips (111, 113, 115) continuous with a pad 121 and other strips (112, 114) isolated from the pad (121). Interdigitated conductive strips (111, 113, 115; 112, 114) extend in a first direction (X).

The device can include a second pad 122, where the strips (111, 113, 115) continuous with the first-mentioned pad 121 are separated from the second pad at ends proximal to the second pad, and strips (112, 114) continuous with the second pad 122 are separated from the first-mentioned pad at ends proximal to the first pad.

As used herein, a pad refers to an area in a patterned conductor layer in a stack of patterned conductor layers, where the area is connected to conductive strips formed in the patterned conductor layer and provides connection to for example a metal line level via an interlayer connector for connection to decoding circuitry. In embodiments, the conductive strips can act as word lines or bit lines. A stack of pads can be formed connected to conductive strips formed in respective patterned conductor layers, and providing connection to respective global conductive lines via respective interlayer connectors. A stack of pads can be formed in a stairstep structure, where respective interlayer connectors are formed on respective pads in respective patterned conductor layers.

An array of vertical pillars (10-16, 20-26, 31-37, 41-47) can extend through the stack of patterned conductor layers, wherein memory cells can be disposed at cross-points between the vertical pillars and patterned conductor layers. The vertical pillars can include data storage structures and semiconductor films.

An array of vertical pillars has an array boundary proximal to the pad. An array boundary can include multiple boundary segments 151-155. An array of vertical pillars can include a block of vertical pillars 210 inside the array boundary, e.g., between a first boundary segment 151 on the left in FIG. 1, and a second boundary segment 152 on the right opposite the first boundary segment in the first direction X.

The array boundary is defined for the purposes of this description as a line extending along the outer edges of the vertical pillars on the perimeter of the pattern of vertical pillars. The vertical pillars on the perimeter include the vertical pillars disposed at ends of rows of vertical pillars in a block of vertical pillars 210. For instance, a first boundary segment 151 can align with an outer edge of a vertical pillar 10 at an end of a row of vertical pillars (10-16) proximal to a first pad 121. For instance, a second boundary segment 152 can align with an outer edge of a vertical pillar 37 at an end of another row of vertical pillars (31-37) proximal to a second pad 122. For instance, a third boundary segment 153 can align with a bottom edge of a bottom row 116 of vertical pillars in a block of vertical pillars 210.

A first set of isolation blocks (131-136) extending through a plurality of patterned conductor layers can separate the conductive strips (111, 113, 115) continuous with the pad 121 from the other strips 112, 114 isolated from the pad. Similarly, a first set of isolation blocks (131-136) extending through a plurality of patterned conductor layers can separate the conductive strips (112, 114) continuous with a second pad 122 from the other strips 111, 113, 115 isolated from the pad 122.

A second set of isolation blocks (140-146) inside the array boundary and extending through the plurality of patterned conductor layers can isolate the other strips from the pad. For instance, isolation blocks 142 and 144 in a second set of isolation blocks can isolate the other strips 112, 114 from the pad 121. Similarly, isolation blocks 141, 143 and 145 in a second set of isolation blocks can isolate the other strips 111, 113, 115 from a second pad 122. The second set of isolation blocks can include isolation blocks (141, 142) connecting adjacent isolation blocks (131 and 132; 132 and 133) in the first set of isolation blocks.

In addition, a pair of isolation blocks (141 and 141a, 142 and 142a) inside the array boundary can isolate the other strips from the pad. For instance, a pair of isolation blocks 142 and 142a inside the array boundary can isolate the other strips 112 from the pad 121, and a pair of isolation blocks 141 and 141a in a second set of isolation blocks can isolate the other strips 111 from the second pad 122.

The etch rate may be much slower for cutting through a stack of patterned conductor layers in a pad (121, 122) without the holes outside the array boundary than through the stack of patterned conductor layers in a block of vertical pillars 210 inside the array boundary. A second set of isolation blocks (140-146) inside the array boundary can be etched through vertical pillars not used for memory cells at the same etch rate as etching the first set of isolation blocks through vertical pillars used for memory cells. Consequently, a single cut using a single mask can be used to etch slits at the same etch rate for the first set of isolation blocks and the second set of isolation blocks.

The device can include a first boundary row of vertical pillars 171 and a second boundary row of vertical pillars 172 disposed adjacent and spanning a block of vertical pillars 210, a first pad 121, and a second pad 122, where the second pad is disposed opposite the first pad across from the block of vertical pillars in the first direction (X).

A fourth boundary segment 154 of an array boundary can align with a bottom edge of vertical pillars in a second boundary row of vertical pillars 172 proximal to the first pad 121. A fifth boundary segment 155 of an array boundary can align with a bottom edge of vertical pillars in a second boundary row of vertical pillars 172 proximal to the second pad 122. A fourth boundary segment 154 is disposed opposite a fifth boundary segment 155 across from a block of vertical pillars 210 in the first direction (X).

The device can include a block isolation structure 170 extending through the stack of patterned conductor layers isolating the first boundary row of vertical pillars 171 from the second boundary row of vertical pillars 172. An adjacent memory block not shown can be disposed above the block isolation structure 170. The vertical pillars in the first and second boundary rows are in contact with sides of the block isolation structure. The vertical pillars in the first and second boundary rows are not used for memory cells, and can be referred to as dummy vertical structures. A block isolation structure 170 is further described in reference to FIG. 2.

In embodiments, vertical pillars in the block of vertical pillars and in the first and second boundary rows can have a common pitch and a common width in the first direction.

Figure 2:
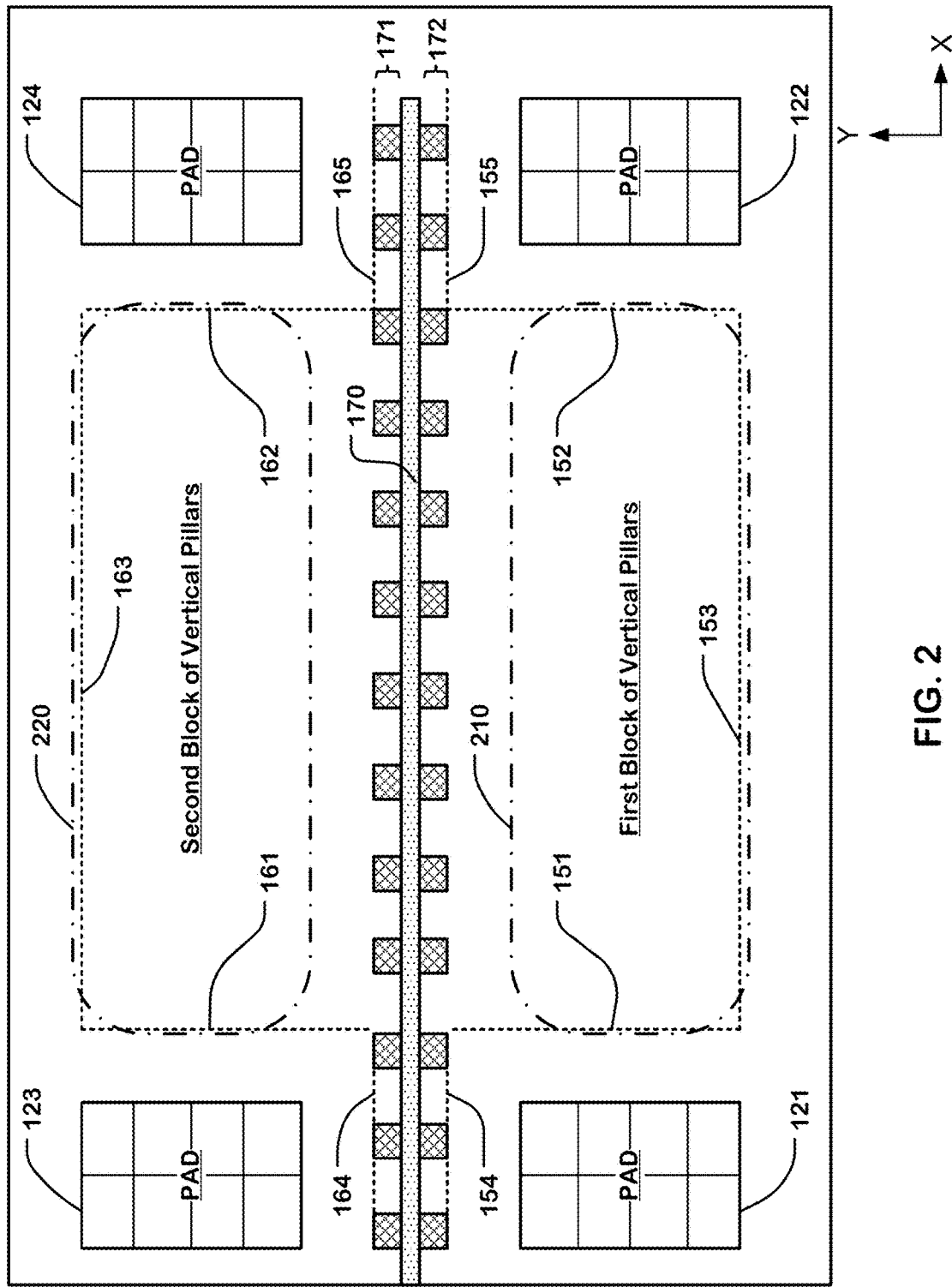
FIG. 2 a simplified layout view of an example 3D memory device, illustrating a block isolation structure separating a pad from another pad and separating a block of vertical pillars from another block of vertical pillars.

FIG. 2 illustrates a simplified layout view 200 of an example 3D memory device, illustrating a block isolation structure separating a pad from another pad and separating a block of vertical pillars from another block of vertical pillars. As shown in the example of FIG. 2, a device can include a first block of vertical pillars 210 inside a first array boundary, and a second block of vertical pillars 220 inside a second array boundary disposed opposite the first block of vertical pillars in the second direction (Y). A first array boundary can include multiple boundary segments 151-155, as described in reference to FIG. 1. Similarly, a second array boundary can include multiple boundary segments 161-165.

A device can include a third pad 123 disposed opposite the first pad 121 in a second direction (Y) orthogonal to a first direction (X) along which the conductive strips extend. Similarly, a device can include a fourth pad 124 disposed opposite the second pad 122 in the second direction (Y).

First and second boundary rows of vertical pillars (171, 172) can extend in the first direction through the stack of patterned conductor layers. The first and second boundary rows can be disposed adjacent and spanning the first pad 121, the block of vertical pillars 210, and the second pad 122. Similarly, the first and second boundary rows can be disposed adjacent and spanning the third pad 122, the second block of vertical pillars 220, and the fourth pad 124. The vertical pillars in the first and second boundary rows may not be used for memory cells.

A block isolation structure 170 extending through the stack of patterned conductor layers can separate the first pad 121 from the third pad 123, separate the second pad 122 from the fourth pad 124, and separate a first block of vertical pillars 210 from a second block of vertical pillars 220. The vertical pillars in the first and second boundary rows can be in contact with sides of the block isolation structure.

Figure 3:
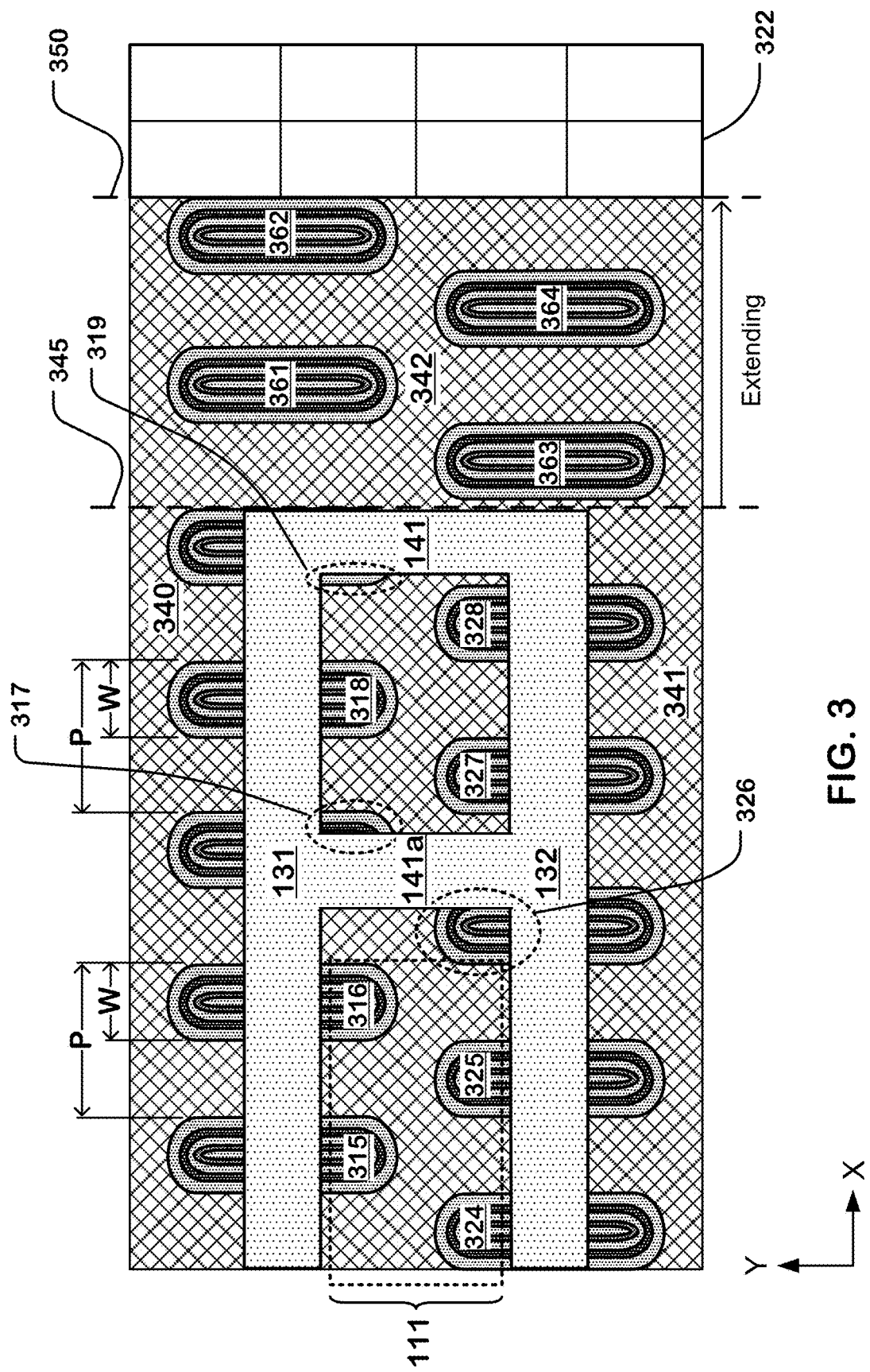
FIG. 3 illustrates a more detailed layout view of an example 3D memory device taken at a patterned conductor layer, including an array extending into a pad.

FIG. 3 illustrates a more detailed layout view of an example 3D memory device taken at a patterned conductor layer, including an array extending into a pad. As shown in the example of FIG. 3, an array can extend into a pad 322 beyond an end 345 of isolation blocks 131 and 132 in the first set of isolation blocks by one or more vertical pillars (361-364). The array can have an array boundary having a boundary segment 350 aligning with an outer edge of a vertical pillar 362 at an end of a row of vertical pillars (315-319, 361-362) proximal to a pad 322. In this example, horizontal conductors 340 and 341 are continuous with the pad 322, providing for electrical connection to the pad and interlayer conductors in contact with the pad in part through the extended part 342 of array region.

As shown in the example of FIG. 3, the second set of isolation blocks can include isolation blocks (141, 141a) connecting a pair of adjacent isolation blocks (131, 132) in the first set of isolation blocks. Some of the vertical pillars (317, 319, 326) between the pad (e.g. 322) and the end of strip 111 can be penetrated by the isolation blocks (e.g. 141, 141a) in the second set of isolation blocks inside the array boundary segment 350, and can be referred to as dummy vertical pillars. The vertical pillars (315, 316, 324, 325) used for memory cells and the vertical pillars (318, 327, 328) not used for memory cells can have a common pitch P and a common width W in the first direction X. The vertical pillars (318, 327, 328) not used for memory cells can be referred to as dummy vertical pillars.

FIGS. 4-13 illustrate stages of an example manufacturing process for a memory device in accordance with an embodiment.

Figure 4:
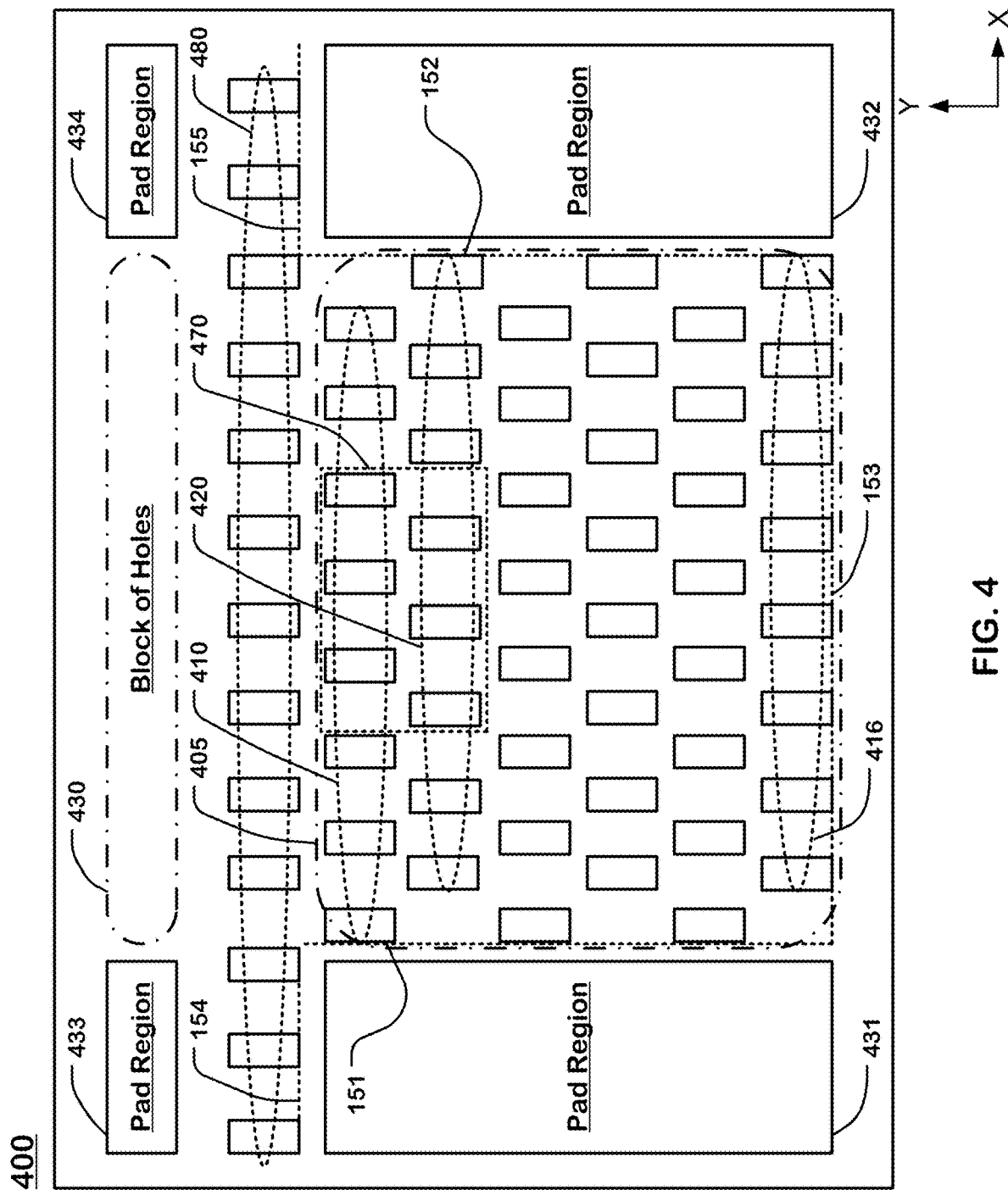

FIG. 4 illustrates a simplified layout view 400 of an example 3D memory device, illustrating an array of holes inside an array boundary at a patterned conductor layer in a stack of patterned conductor layers. As shown in the example of FIG. 4, an array of holes can include a block of holes in a first array region 405 including multiple rows of holes (410, 420). An array boundary proximal to a pad region (431, 432) can include multiple boundary segments 151-155, where a pad region is a region where a pad (e.g. 121, 122, FIG. 1) can be formed. A block of holes can be disposed between a first boundary segment 151 on the left in FIG. 4 and a second boundary segment 152 on the right opposite the first boundary segment in the first direction X.

As shown in the example of FIG. 4, the simplified layout view can include a boundary row of holes 480 disposed adjacent and spanning a block of holes, a first pad region 431 and a second pad region 432. A third pad region 433 and a fourth pad region 434 are disposed opposite a first pad region 431 and a second pad region 432, respectively, across a boundary row of holes 480 in the second direction Y. A second block of holes in a second array region 430 is disposed opposite a first block of holes across a boundary row of holes 480 in the second direction Y.

A fourth boundary segment 154 of an array boundary can be from a bottom edge of holes in a boundary row of holes 480 proximal to the first pad region 431. A fifth boundary segment 155 of an array boundary can be from a bottom edge of holes in a boundary row of holes 480 proximal to the second pad region 432.

Figure 5:
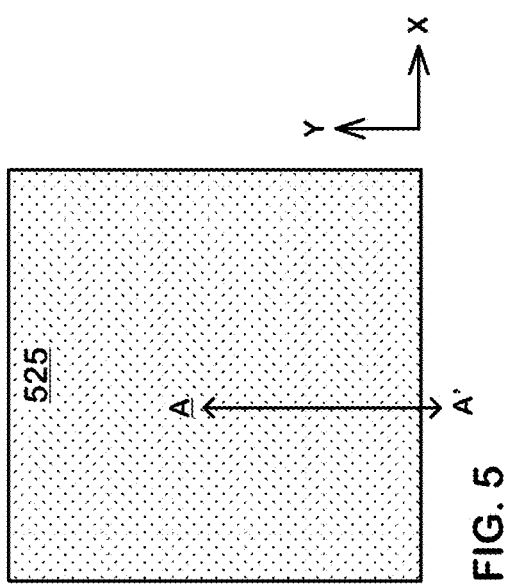
Figure 5A:
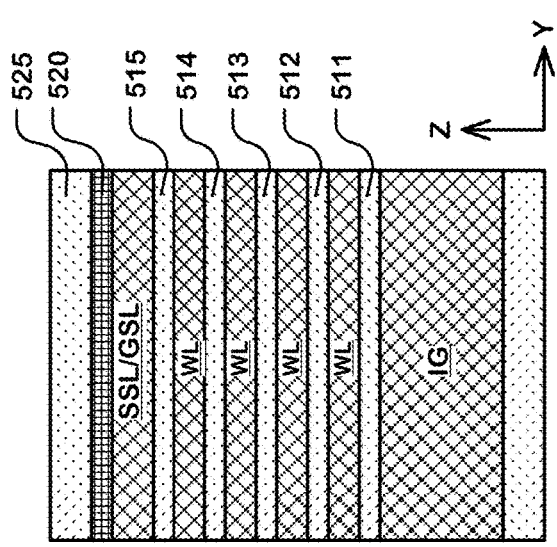

FIGS. 5 and 5A illustrate a stage of the process flow after forming a stack of patterned conductor layers separated by insulating layers. FIG. 5 illustrates a top insulating layer 525 over the stack of patterned conductor layers. FIG. 5A is a vertical cross-section of FIG. 5 taken along a line A-A' shown in FIG. 5, where the line A-A' is oriented in the second direction (Y-direction) orthogonal to the first direction (X-direction). In one embodiment, a stack of patterned conductor layers can include a bottom conductor layer that can act as an inversion gate layer (IG) or a layer for assist gates, a top conductor layer that can be etched to form string select lines (SSL) or ground select line (GSL), and a plurality of intermediate conductor layers between the top conductor layer and the bottom conductor layer that can be etched to form word lines (WL). In an alternative embodiment, a stack of patterned conductor layers can include a bottom conductor layer that can act as ground select layer (GSL), a top conductor layer that can be etched to form string select lines (SSL), and a plurality of intermediate conductor layers between the top conductor layer and the bottom conductor layer that can be etched to form word lines (WL). The plurality of intermediate conductor layers can include N layers, where N is greater than 2. The plurality of intermediate conductor layers can be etched to form dummy word lines that are not coupled to memory cells or are used to control operations of memory cells. The conductor layers can comprise a variety of materials including doped semiconductors, metals, and conductive compounds, including materials comprising Si, Ge, SiGe, SiC, TiN, TaN, W, and Pt.

As shown in the example of FIG. 5A, insulating layers 511-515 separate the conductor layers. The insulating layers can comprise a silicon oxide or other dielectric on a semiconductor substrate. A top layer 520 of silicon nitride can be disposed in this example on a stack of conductor layers, and the top insulating layer 525 can be disposed on the top layer 520 of silicon nitride.

Figure 6:
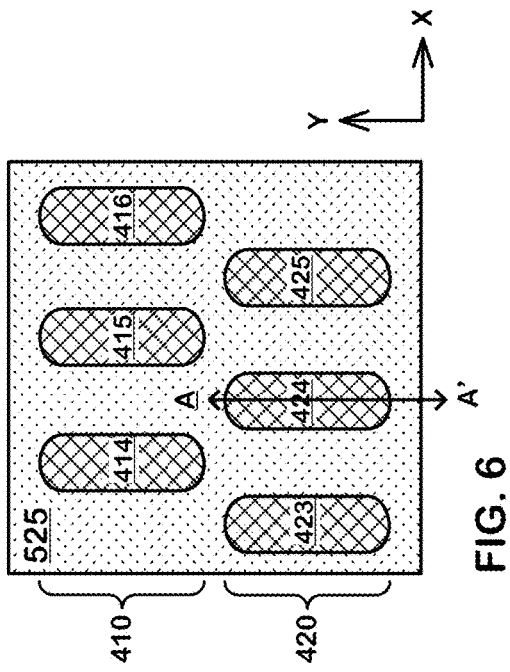
Figure 6A:
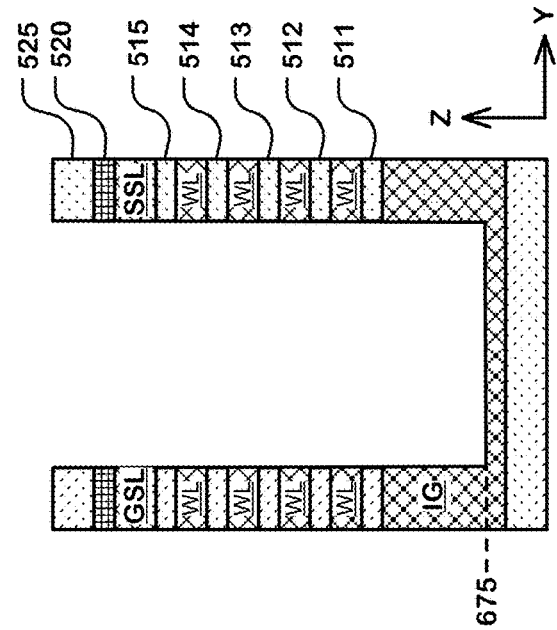

FIGS. 6 and 6A illustrate a stage of the process flow after forming an array of holes through a stack of conductor layers. FIG. 6 is an enlarged view of a sub-area 470 in FIG. 4, including holes from two rows of holes. In the example of FIG. 6, a first row 410 of holes (414-416) and a second row 420 of holes (423-425) are arranged in the first direction (X-direction). In one embodiment, each of the holes in the rows can have an elliptical cross section with a major axis in the second direction (Y direction). In an alternative embodiment, each of the holes in the rows can have an elliptical cross section with a major axis tilted relative to the first direction (X-direction). In other embodiments, the holes can have other shapes of horizontal cross sections including circular, diamond, square and rectangular shapes.

FIG. 6A is a vertical cross-section of a hole shown in FIG. 6, taken along the line A-A'. The holes in the rows of holes are etched through the top insulating layer 525, the top layer 520 of silicon nitride, the top conductive layer (SSL/GSL), the plurality of intermediate conductor layers (WL), and partially through the bottom conductive layer (IG). The etching process can stop at a hole etch level 675 in the bottom conductive layer (IG).

FIGS. 7 and 7A illustrate a stage of the process flow after forming vertical pillars on sidewalls and bottom surfaces of the holes in the array of holes, where the vertical pillars can include data storage structures and semiconductor films. FIG. 7A is a vertical cross-section of FIG. 7 taken along the line A-A' shown in FIG. 7, illustrating a U-shaped channel.

Data storage structures 710 are deposited on sidewalls of the holes, over the bottom of the holes, and over the top insulating layer 525. A semiconductor film 720 is deposited over and in contact with the data storage structures 710, forming a U-shaped channel. Data storage structures 710 includes a horizontal layer of data storage structures 713 in the holes, and a semiconductor film 720 includes a horizontal semiconductor film 723 disposed over the horizontal layer of data storage structures 713. At this stage of the process flow, data storage structures 710 can be deposited on sidewalls of the holes in the boundary row of holes (480, FIG. 4), and semiconductor films 720 can be deposited over and in contact with the data storage structures 710 in the boundary row of holes.

The semiconductor films (e.g. 720) can comprise semiconductor materials adapted to act as channels for the memory cells, such materials as Si, Ge, SiGe, GaAs, SiC, and graphene. The data storage structures (e.g. 710) can include a multilayer data storage structure, known from flash memory technologies, including for example flash memory technologies known as ONO (oxide-nitride-oxide), ONONO (oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), and MA BE-SONOS (metal-high-k bandgap-engineered silicon-oxide-nitride-oxide-silicon).

FIGS. 8 and 8A illustrate a stage of the process flow after filling the holes in the rows of holes with an insulating material 830. FIG. 8A illustrates a vertical cross-section of FIG. 8 taken along the line A-A' shown in FIG. 8. The insulating material 830 is also deposited over the top surface of the semiconductor film 720. At this stage of the process flow, the holes in the boundary row of holes (480, FIG. 4) can be filled with an insulating material 830.

Figure 9:
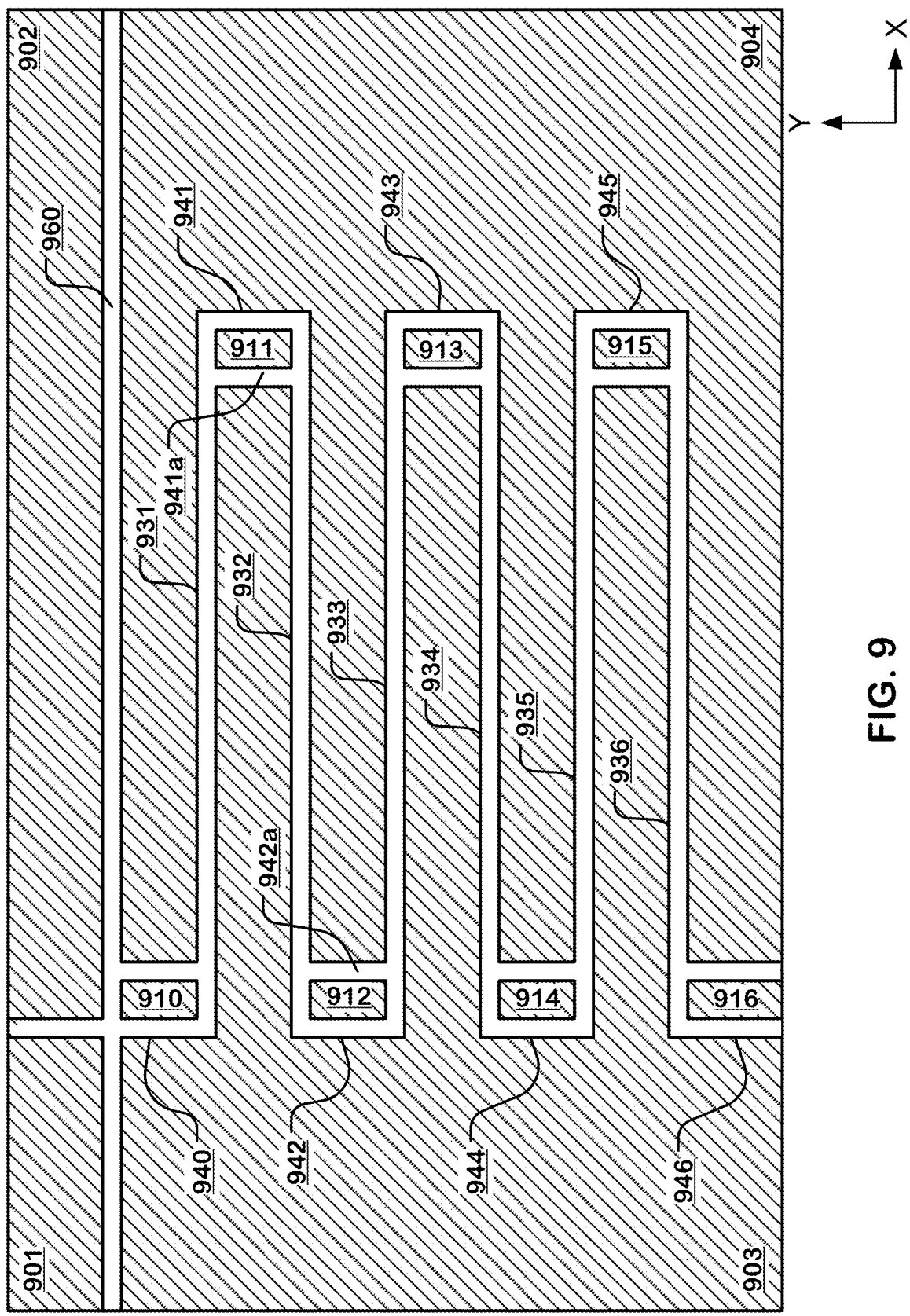

FIG. 9 illustrates a photoresist hard mask in this example suitable for etching a first set of slits and a second set of slits over the structure shown in FIG. 4. The hard mask is patterned to define mask regions (e.g. 901-904, 910-916) and open etch regions (e.g. 940-945, 931-936, 960). The mask regions correspond to the interdigitated conductive strips (111-115, FIG. 1) continuous with a pad (121, 122, FIG. 1) and other strips isolated from the pad. A first set of open etch regions (931-936) extending in the first direction (X) corresponds to a first set of isolation blocks (131-136, FIG. 1). A second set of open etch regions (940-946, 941a, 942a) extending in the second direction (Y) corresponds to a second set of isolation blocks (140-146, 141a, 142a, FIG. 1). A third set of open etch regions (960) corresponds to a block isolation structure (170, FIG. 1). The open etch regions are not protected by the mask regions and will be removed.

Figure 10:
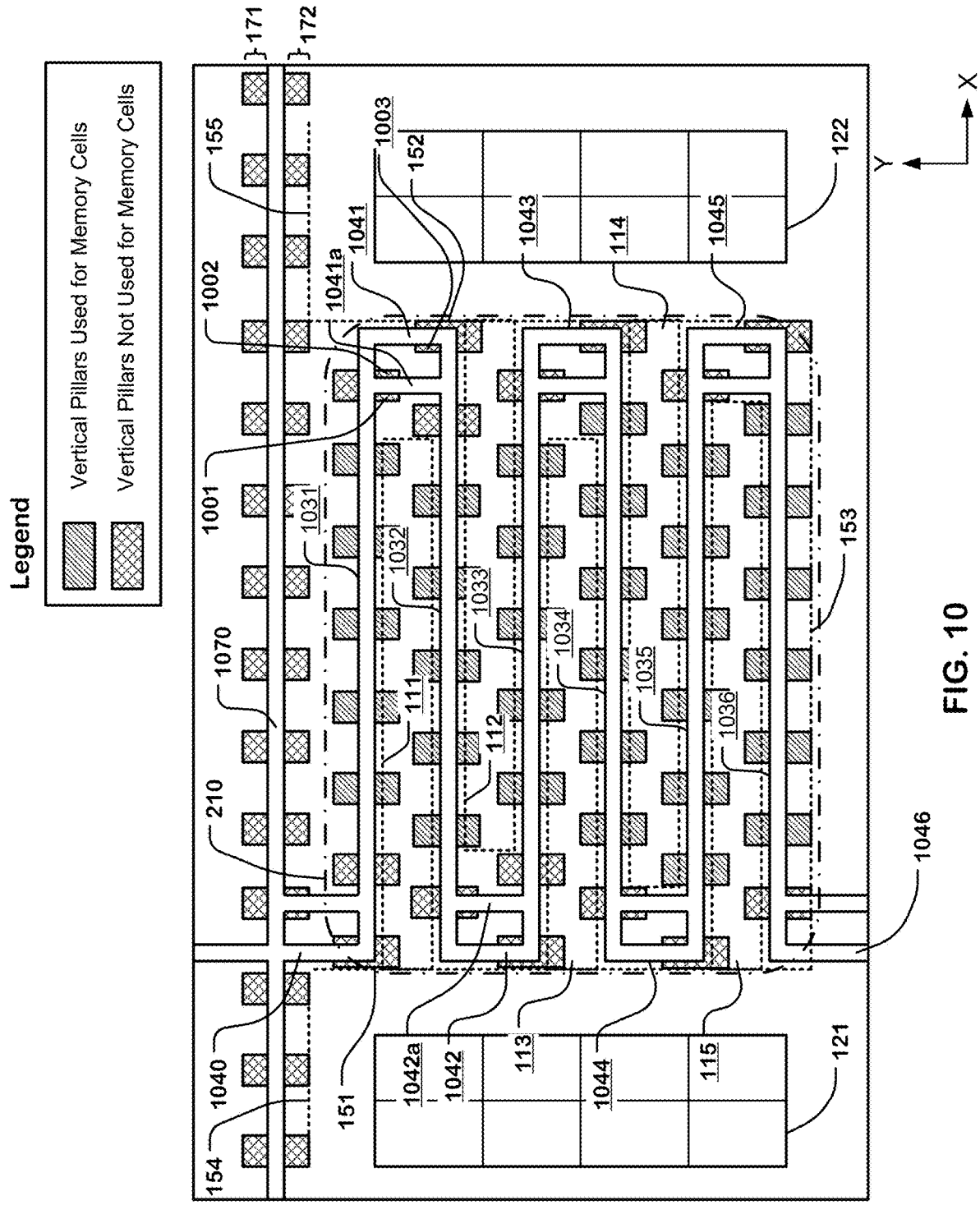

FIG. 10 illustrates a stage of the process flow after etching a first set of slits and a second set of slits through a stack of conductor layers using a single photoresist hard mask such as shown in FIG. 9. The second set of slits is inside an array boundary as described in reference to FIG. 4. As shown in the example of FIG. 10, a first set of slits includes slits (1031-1036) disposed across the holes in respective rows of holes. A second set of slits includes slits (1040-1046, 1041a, 1042a) connecting adjacent slits in the first set of slits at ends. The first set of slits extends in the first direction (X), and the second set of slits extends in the second direction (Y) orthogonal to the first direction.

The first and second sets of slits are etched through the stack of conductor layers, thereby forming interdigitated conductive strips including strips continuous with a pad and other strips isolated from the pad. For instance, conductive strips (111, 113, 115) are continuous with a first pad (121) and other strips (112, 114) are isolated from the pad (121). For instance, conductive strips (112, 114) are continuous with a second pad (122) and other strips (111, 113, 115) are isolated from the second pad (122).

At this stage of the process flow, a block boundary slit 1070 can be etched through the conductor layers using the same single photoresist hard mask. The block boundary slit is disposed across the holes in a boundary row of holes (480, FIG. 4), where a boundary row of holes 480 is disposed adjacent and spanning a first pad region 431 and a second pad region 432, and a first array region 405.

Figure 11:
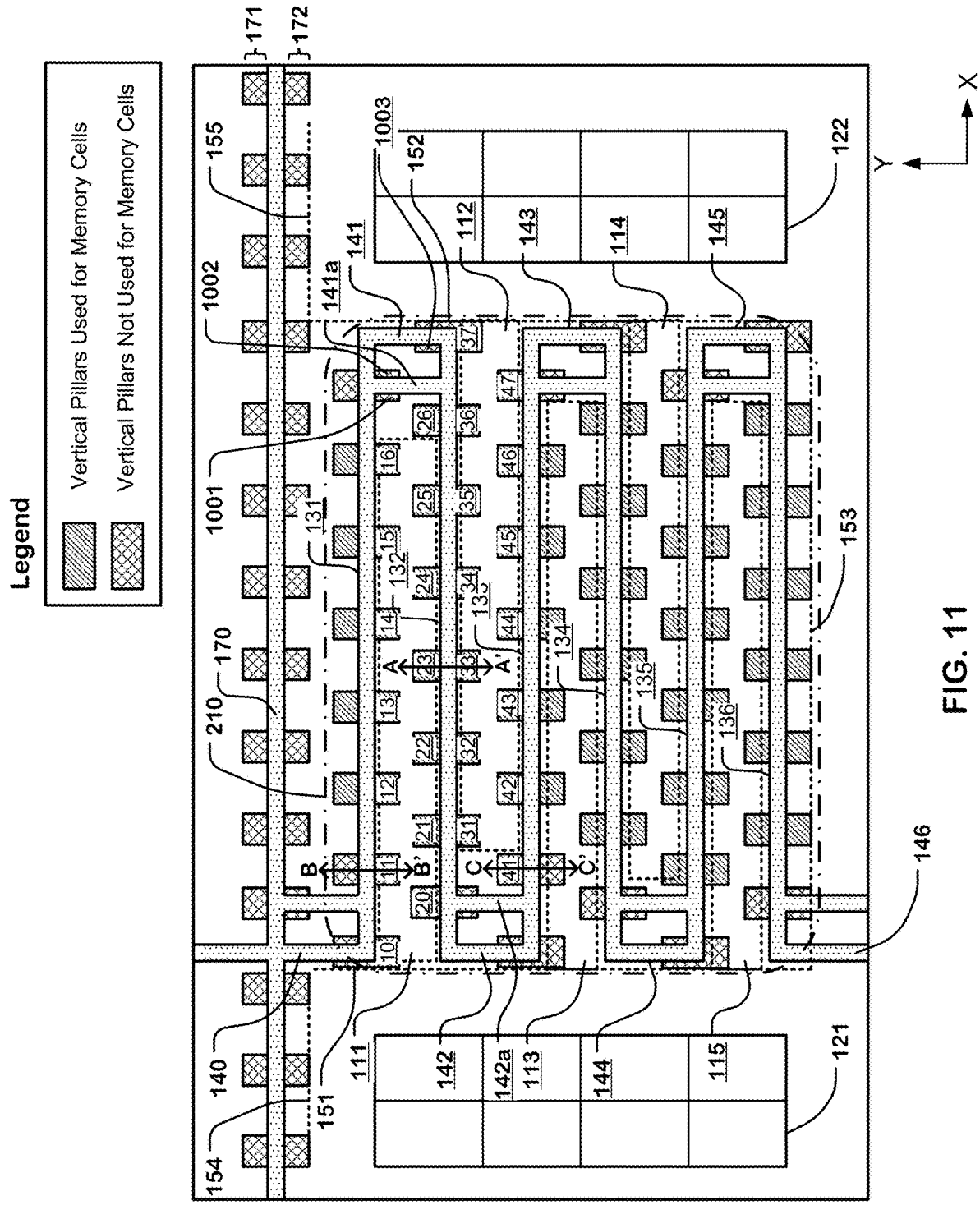

FIG. 11 illustrates a stage of the process flow after forming a first set of isolation blocks and a second set of isolation blocks through the patterned conductor layers. For instance, the first and second sets of isolation blocks can be formed by filling the first and second sets of slits with insulation material in a single fill operation. A first set of isolation blocks (131-136) can separate the strips (111, 113, 115) continuous with the pad (121) from the other strips isolated from the pad. A second set of isolation blocks (140-146, 141a, 142a) inside the array boundary can isolate the other strips (112, 114) from the pad (121).

The second set of isolation blocks can include isolation blocks (e.g. 141) connecting a pair of adjacent isolation blocks (e.g. 131, 132) in the first set of isolation blocks. Some of the vertical pillars (1001-1003) between the pad 122 and the end of strip 111 can be penetrated by the isolation blocks (e.g. 141, 141a) in the second set of isolation blocks inside the array boundary.

At this stage of the process flow, a block isolation structure 170 can be formed in a block boundary slit (1070, FIG. 10) through the stack of patterned conductor layers. The vertical pillars (171, 172) in the first and second boundary rows can be in contact with sides of the block isolation structure, and not used for memory cells. A block isolation structure 170 can separate a first pad region (431, FIG. 4) from a third pad region (433, FIG. 4), FIG. 4), separate a second pad region (432, FIG. 4) from a fourth pad region (434, FIG. 4), and separate a first array region (405, FIG. 4) from a second array region (430, FIG. 4).

Figure 12:
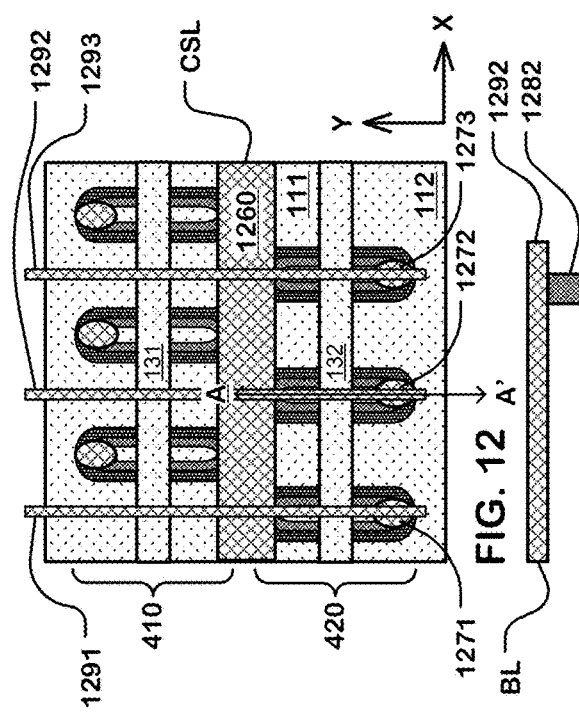
Figure 12A:
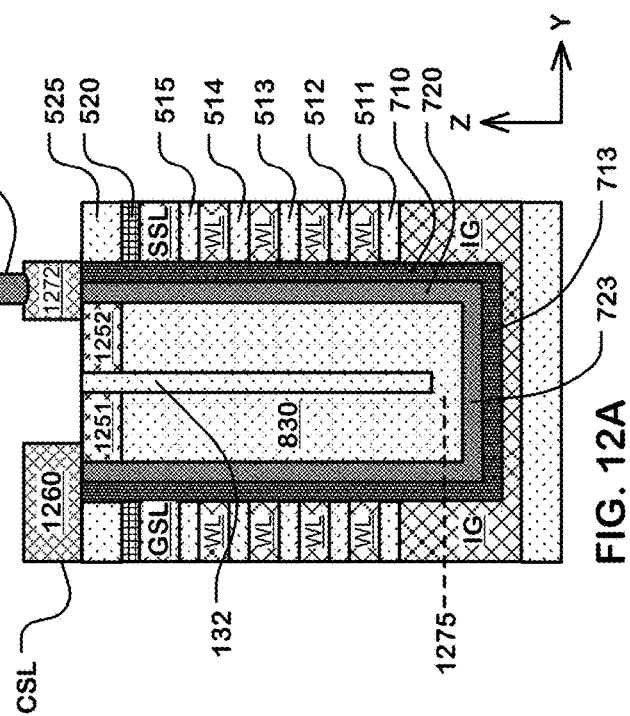

FIGS. 12 and 12A illustrate a stage of the process flow after forming a common source line 1260 and a set of bit lines 1291-1293 coupled to a plurality of vertical pillars used for memory cells via bit line contacts 1271-1273, respectively. The common source line CSL 1260 can extend in the first direction (X-direction), the set of bit lines can extend in the second direction (Y-direction). FIG. 12A illustrates a vertical cross-section of FIG. 12 taken along the line A-A', which can correspond to the line A-A' shown in FIG. 11.

The insulating material 830 deposited in the holes (FIG. 8) can be etched back to form a recess in the holes, and a conductive material can be deposited in the recess. The stage of the process flow for forming first and second sets of isolation blocks (FIG. 11) can include etching the conductive material in the recess to form first and second plugs (1251, 1252) over the top surface of the insulating material 830 in the holes in the rows of holes, where the first and second plugs are connected to the semiconductor films 720. The etching process to etch the slits (FIG. 10) can stop at a slit etch level 1275 in the bottom conductive layer (IG). The slit etch level 1275 is disposed below the plurality of conductor layers (WL) and above a horizontal semiconductor film 723 disposed over bottom surfaces of the holes in the rows of holes. In memory architectures including U-shaped channels, a bottom portion of the U-shaped channel, e.g, a horizontal semiconductor film 723, must be well connected. In other words, a cut through the holes must not cut through a bottom portion of the U-shaped channel in the holes.

A common source line CSL 1260 is connected to the first plug 1251 and a top surface of the semiconductor films 720. A bit line contact 1272 is connected to the second plug 1252 and a top surface of the semiconductor films 720. A via 1282 is connected to the bit line contact 1272. A bit line BL 1292 is connected to the vertical semiconductor films 720 via the bit line contact 1272 and the via 1282.

Figure 13:
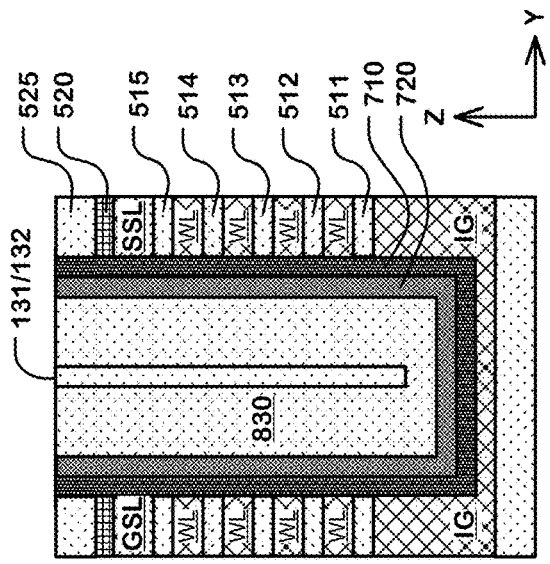

FIG. 13 illustrates vertical pillars not used for memory cells. First, referring to FIG. 11, an array of vertical pillars can include vertical pillars (10, 11, 20) not used for memory cells disposed between the pad 121 and the plurality of vertical pillars (12-16, 21-25) used for memory cells in the conductive strips 111 continuous with the pad 121. An array of vertical pillars can include vertical pillars 41 not used for memory cells disposed between the pad 121 and a plurality of vertical pillars (31-35, 42-46) used for memory cells in other conductive strips 112 isolated from the pad 121.

FIG. 13 illustrates a vertical cross-section of a vertical pillar 11 not used for memory cells taken along the line B-B' in FIG. 11, or a vertical cross-section of a vertical pillar 41 not used for memory cells taken along the line C-C' in FIG. 11. A difference between the structures illustrated in FIGS. 12 and 12A and FIG. 13 is that a common source line 1260 and a set of bit lines 1291-1293 coupled to the vertical pillars used for memory cells as shown in FIGS. 12 and 12A may not be coupled to the vertical pillars not used for memory cells as shown in FIG. 13 for a finished product. Vertical pillars not used for memory cells as shown in FIG. 13 also may not be coupled to the bit line contact 1272 and the via 1282 as shown in FIGS. 12 and 12A.

Figure 14:
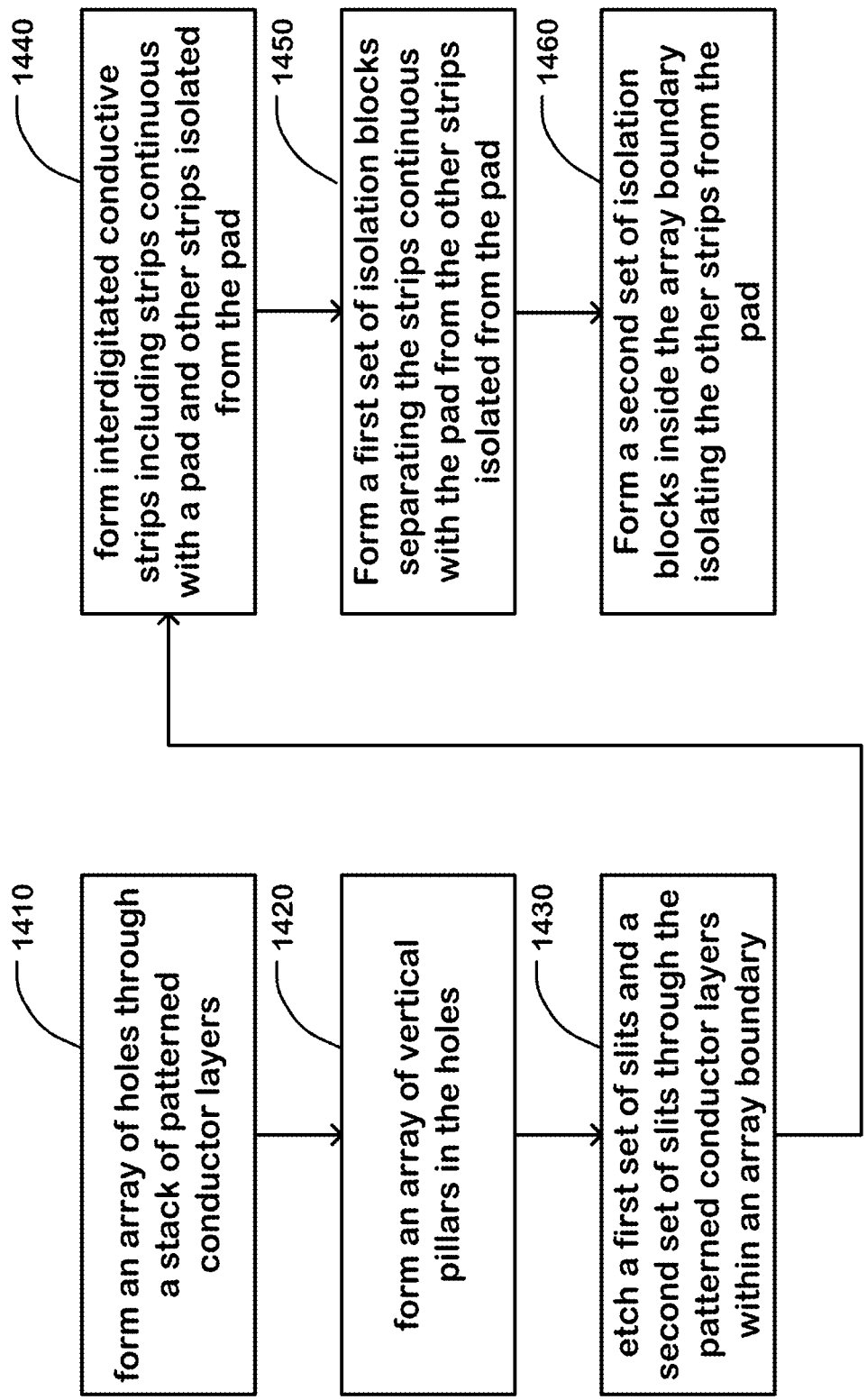
FIG. 14 is a flow chart illustrating a method for manufacturing a memory device.

FIG. 14 is a flow chart illustrating a method for manufacturing a memory device. At Step 1410, an array of holes can be formed through a stack of patterned conductor layers separated by insulating layers. This step is further described in reference to FIGS. 4, 5, 5A, 6 and 6A.

At Step 1420, an array of vertical pillars can be formed extending through the stack of patterned conductor layers in the holes in the array of holes. For instance, the vertical pillars can include data storage structures and semiconductor films formed on sidewalls of the holes in the array of holes. This step is further described in reference to FIGS. 7, 7A, 8 and 8A.

At Step 1430, a first set of slits and a second set of slits can be etched through the stack of patterned conductor layers using a single mask. The first set of slits can be disposed across the holes in respective rows of holes, and the second set of slits can include slits connecting adjacent slits in the first set of slits at ends. Some of the vertical pillars between the pad and the other strips isolated from the pad can be penetrated by the isolation blocks in the second set of isolation blocks inside the array boundary. This step is further described in reference to FIGS. 9 and 10.

At Step 1440, interdigitated conductive strips can be formed including strips continuous with a pad and other strips isolated from the pad. Memory cells can be disposed at cross-points between the vertical pillars and patterned conductor layers. The array of vertical pillars can have an array boundary proximal to the pad. At this step, a second pad (122) can be etched, wherein the strips continuous with the first pad (121) can be separated from the second pad at ends proximal to the second pad, and strips continuous with the second pad are separated from the first-mentioned pad at ends proximal to the first-mentioned pad. This step is further described in reference to FIG. 10.

In embodiments, the array boundary can extend into the pad beyond an end of isolation blocks in the first set of isolation blocks by one or more vertical pillars.

At Step 1450, a first set of isolation blocks (131-136) can be formed in the first set of slits through the plurality of patterned conductor layers, separating the strips continuous with the pad from the other strips isolated from the pad. This step is further described in reference to FIG. 11.

At Step 1460, a second set of isolation blocks can be formed in the second set of slits inside the array boundary and extending through the plurality of patterned conductor layers isolating the other strips from the pad. The second set of isolation blocks can include isolation blocks connecting adjacent isolation blocks in the first set of isolation blocks at ends proximal to the pad. This step is further described in reference to FIG. 11.

The array of vertical pillars can include a plurality of vertical pillars used for memory cells in the strips continuous with the pad, and vertical pillars not used for memory cells disposed between the pad and the plurality of vertical pillars used for memory cells. The method can include forming a set of bit lines coupled to the plurality of vertical pillars used for memory cells in the strips continuous with the pad, and not coupled to the vertical pillars not used for memory cells.

The array of vertical pillars can include a block of vertical pillars inside the array boundary, and a third pad disposed opposite the first-mentioned pad in a second direction orthogonal to a first direction along which the conductive strips extend.

At Step 1410, a boundary row of holes (480, FIG. 4) can be formed through the stack of patterned conductor layers, the boundary row of holes being disposed adjacent and spanning the first and second pad regions and the block of holes.

At Step 1420, first and second boundary rows of vertical pillars (171, 172, FIG. 10) can be formed extending in the first direction through the stack of patterned conductor layers, the first and second rows being disposed adjacent and spanning the first and second pads and the block of vertical pillars. The vertical pillars in the first and second boundary rows are not used for memory cells.

At Step 1430, a block boundary slit (1070, FIG. 10) can be etched through the stack of patterned conductor layers using the single mask (FIG. 9), the block boundary slit disposed across the holes in the boundary row of holes.

At Step 1450, a block isolation structure (170, FIGS. 2 and 11) can be formed through the stack of patterned conductor layers, where the vertical pillars in the first and second boundary rows can be in contact with sides of the block isolation structure.

Figure 15C:
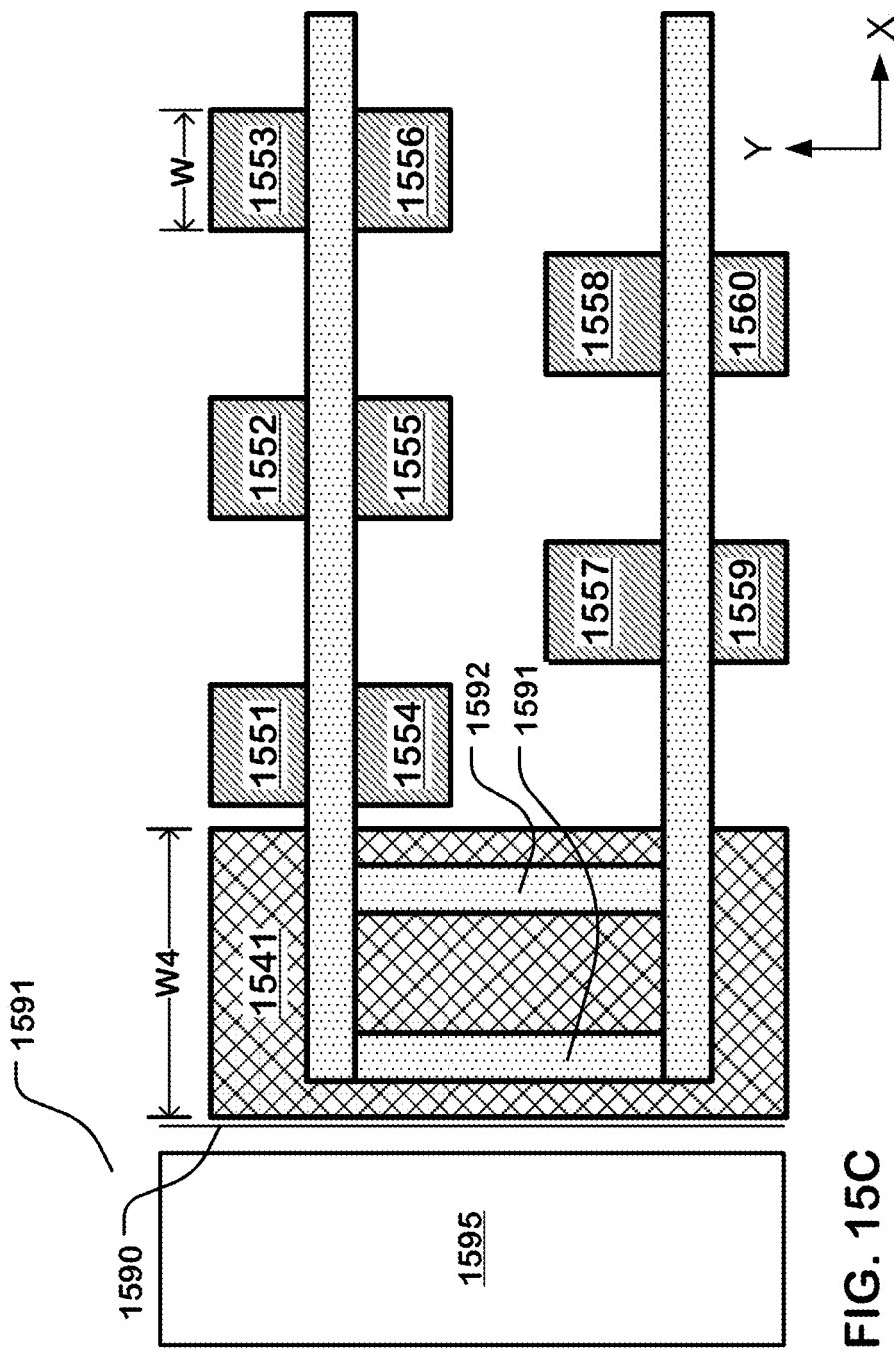

FIGS. 15A, 15B and 15C illustrate alternative implementations of vertical pillars not used for memory cells inside the array boundary disposed between a pad and a plurality of vertical pillars used for memory cells. Such vertical pillars not used for memory cells can have a different width in the first direction (X) than a width of vertical pillars used for memory cells.

As shown in the example of FIG. 15A, vertical pillars (1501, 1504) not used for memory cells are disposed inside the array boundary 1590 between a pad 1595 and a plurality of vertical pillars (1511-1518) used for memory cells. Vertical pillars not used for memory cells can have a different width W1 in the first direction (X) than a width W of vertical pillars used for memory cells. Blocks (1591, 1592) in the second set of isolation blocks inside the array boundary 1590 can penetrate some of the vertical pillars (1501, 1504) between the pad 1595 and a plurality of vertical pillars used for memory cells.

As shown in the example of FIG. 15B, vertical pillars (1521, 1522, 1528) not used for memory cells are disposed inside the array boundary 1590 between a pad 1595 and a plurality of vertical pillars (1531-1538) used for memory cells. Vertical pillars not used for memory cells can have a different width W2 or W3 in the first direction (X) than a width W of vertical pillars used for memory cells. Blocks (1591, 1592) in the second set of isolation blocks inside the array boundary 1590 can penetrate some of the vertical pillars (1521, 1522, 1528) between the pad 1595 and a plurality of vertical pillars used for memory cells. In this example, a vertical pillar 1521 can encompass one block 1591 in the second set of isolation blocks between the pad 1595 and a plurality of vertical pillars used for memory cells.

As shown in the example of FIG. 15C, vertical pillars (1541) not used for memory cells are disposed inside the array boundary 1590 between a pad 1595 and a plurality of vertical pillars (1551-1560) used for memory cells. Vertical pillars not used for memory cells can have a different width W4 in the first direction (X) than a width W of vertical pillars used for memory cells. Blocks (1591, 1592) in the second set of isolation blocks inside the array boundary 1590 can penetrate some of the vertical pillars (1541) between the pad 1595 and a plurality of vertical pillars used for memory cells. In this example, a vertical pillar 1541 can encompass two blocks (1591, 1592) in the second set of isolation blocks between the pad 1595 and a plurality of vertical pillars used for memory cells.

Figure 16A:
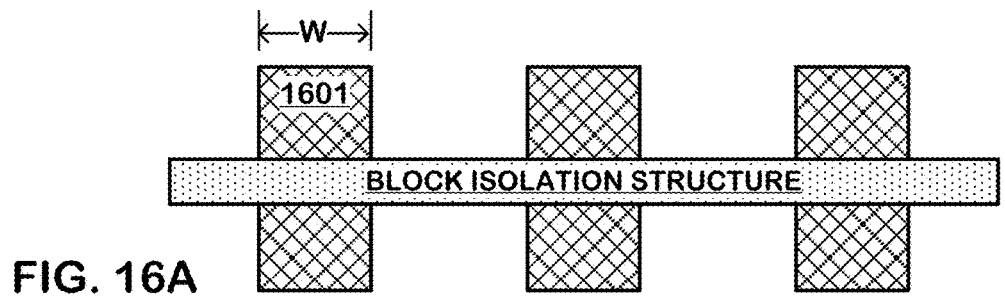
FIGS. 16A, 16B, 16C and 16D illustrate alternative implementations of vertical pillars in contact with a block isolation structure.
Figure 16B:
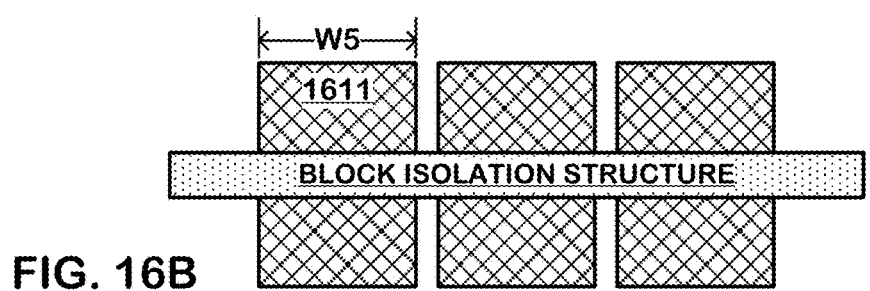
Figure 16C:
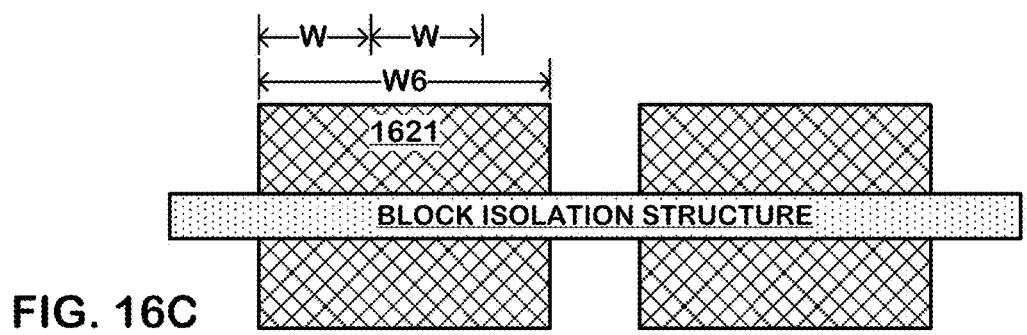

FIGS. 16A, 16B and 16C illustrate alternative implementations of vertical pillars in contact with a block isolation structure, where a block isolation structure separates a first pad region from a second pad region disposed opposite the first pad region in a second direction (Y) orthogonal to the first direction (X). A block isolation structure 170 is described in reference to FIGS. 1 and 11. Vertical pillars in contact with a block isolation structure can have a width W in the first direction (X) equal to or different than a width (W, FIG. 3) of vertical pillars used for memory cells.

As shown in the example of FIG. 16A, vertical pillars (e.g. 1601) in contact with a block isolation structure can have a width W in the first direction (X) equal to a width W of vertical pillars used for memory cells (e.g. 1511-1518, FIG. 15A).

As shown in the example of FIG. 16B, vertical pillars (e.g. 1611) in contact with a block isolation structure can have a width W5 in the first direction (X) greater than a width W of vertical pillars used for memory cells.

As shown in the example of FIG. 16C, vertical pillars (e.g. 1621) in contact with a block isolation structure can have a width W6 in the first direction (X) greater than two times a width W of vertical pillars used for memory cells.

Figure 16D:
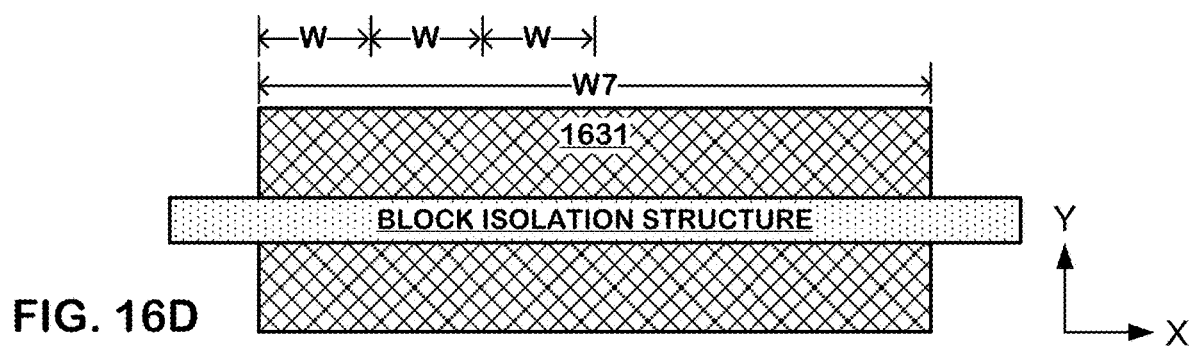

As shown in the example of FIG. 16D, vertical pillars (e.g. 1631) in contact with a block isolation structure can have a width W6 in the first direction (X) greater than three times a width W of vertical pillars used for memory cells.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
    a stack of patterned conductor layers, at least a plurality of the layers comprising conductive strips including strips continuous with a pad and other strips isolated from the pad,
    an array of vertical pillars extending through the stack of patterned conductor layers wherein memory cells are disposed at cross-points between the vertical pillars and patterned conductor layers, the array having an array boundary proximal to the pad;
    a first set of isolation blocks extending through the plurality of patterned conductor layers separating the strips continuous with the pad from the other strips isolated from the pad; and
    a second set of isolation blocks inside the array boundary and extending through the plurality of patterned conductor layers isolating the other strips from the pad.

2. The memory device of claim 1, wherein the second set of isolation blocks include isolation blocks connecting a pair of adjacent isolation blocks in the first set of isolation blocks.

3. The memory device of claim 1, wherein some of the vertical pillars between the pad and the other strips isolated from the pad are penetrated by the isolation blocks in the second set of isolation blocks inside the array boundary.

4. The memory device of claim 1, wherein the array extends into the pad beyond an end of isolation blocks in the first set of isolation blocks by one or more vertical pillars.

5. The memory device of claim 1, wherein the array of vertical pillars includes a plurality of vertical pillars used for memory cells in the strips continuous with the pad, and vertical pillars not used for memory cells disposed between the pad and the plurality of vertical pillars used for memory cells, the memory device further comprising:
    a set of bit lines, overlying the array and extending in a bit line direction, coupled to the plurality of vertical pillars used for memory cells.

6. The memory device of claim 5, wherein the conductive strips extend in a first direction orthogonal to the bit line direction, the vertical pillars used for memory cells and the vertical pillars not used for memory cells have a common pitch and a common width in the first direction.

7. The memory device of claim 5, including a block isolation structure penetrating vertical pillars not used for memory cells inside the array boundary, the block isolation structure extending in a first direction orthogonal to the bit line direction, and wherein the conductive strips extend in the first direction, the vertical pillars not used for memory cells penetrated by the block isolation structure have a different width in the first direction than the vertical pillars used for memory cells.

8. The memory device of claim 1, comprising:
    a second pad, wherein the strips continuous with the first-mentioned pad are separated from the second pad at ends proximal to the second pad, and strips continuous with the second pad are separated from the first-mentioned pad at ends proximal to the first-mentioned pad.

9. The memory device of claim 1, comprising:
    a block of vertical pillars inside the array boundary;
    a third pad disposed opposite the first-mentioned pad in a second direction orthogonal to a first direction along which the conductive strips extend;
    first and second boundary rows of vertical pillars extending in the first direction through the stack of patterned conductor layers, the first and second boundary rows being disposed adjacent and spanning the first-mentioned pad and the block of vertical pillars, the vertical pillars in the first and second boundary rows not used for memory cells; and
    a block isolation structure extending through the stack of patterned conductor layers separating the first-mentioned pad from the third pad, the vertical pillars in the first and second boundary rows in contact with sides of the block isolation structure.

10. The memory device of claim 9, comprising:
    a second block of vertical pillars disposed opposite the first-mentioned block of vertical pillars in the second direction,
    the block isolation structure separating the first-mentioned block of vertical pillars from the second block of vertical pillars.

11. A 3D circuit, comprising:
    a stack of patterned conductor layers, at least a plurality of the layers comprising conductive strips including strips continuous with a pad and other strips isolated from the pad;
    an array of circuit structures in the stack of patterned conductor layers, the array having an array boundary proximal to the pad;

a first set of isolation blocks extending through the plurality of patterned conductor layers separating the strips continuous with the pad from the other strips isolated from the pad; and
a second set of isolation blocks inside the array boundary and extending through the plurality of patterned conductor layers isolating the other strips from the pad.

\* \* \* \* \*